United States Patent
Samuels et al.

(10) Patent No.: US 7,128,847 B2
(45) Date of Patent: Oct. 31, 2006

(54) LIQUID CRYSTALLINE POLYMERIC COMPOSITIONS

(75) Inventors: Michael Robert Samuels, Wilmington, DE (US); Michael Joseph Molitor, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/617,117

(22) Filed: Jul. 10, 2003

(65) Prior Publication Data

US 2004/0056233 A1    Mar. 25, 2004

Related U.S. Application Data

(60) Provisional application No. 60/398,710, filed on Jul. 25, 2002.

(51) Int. Cl.
  C09K 19/52   (2006.01)
  C09K 19/38   (2006.01)
  H01R 13/648  (2006.01)
  C08J 5/08    (2006.01)
(52) U.S. Cl. .............. 252/299.01; 252/299.5; 252/299.6; 439/607; 524/486
(58) Field of Classification Search ........... 252/299.01, 252/299.6, 299.5; 349/10, 86, 183; 520/1; 522/1; 523/1, 171, 218, 400, 427, 440, 443, 523/444; 524/798, 848, 486; 528/86, 176, 528/332, 335; 439/607
See application file for complete search history.

(56) References Cited

U.S. PATENT DOCUMENTS

| | | | |
|---|---|---|---|
| 4,118,372 A | 10/1978 | Schaefgen | |
| 5,110,896 A | 5/1992 | Waggoner et al. | |
| 5,348,990 A | 9/1994 | Walpita | |
| 5,397,502 A | 3/1995 | Waggoner et al. | |
| 5,466,744 A | 11/1995 | Evans et al. | |
| 5,811,042 A * | 9/1998 | Hoiness | 264/122 |
| 6,388,202 B1 * | 5/2002 | Swirbel et al. | 174/261 |

FOREIGN PATENT DOCUMENTS

| | | |
|---|---|---|
| EP | 0 512 401 | 11/1992 |
| EP | 870 795 A1 | 10/1998 |
| WO | WO 94/26802 | 11/1994 |
| WO | WO 99/52978 | 10/1999 |

OTHER PUBLICATIONS

Patent Abstracts of Japan, Publ. No. 04055437, Feb. 24, 1992, Matsushita Electric Works, Ltd. "Prepreg for Laminated Board with Low Dielectric Constant".

* cited by examiner

*Primary Examiner*—Shean C. Wu

(57) ABSTRACT

Disclosed are liquid crystalline polymer compositions, which are melt moldable, and which contain a perfluorinated polymer, and a particulate aramid, and optionally contain hollow glass or quartz spheres, and which usually have low dielectric constants. They are particularly useful as electrical connectors and substrates for other electronic applications which use high frequency signals.

15 Claims, No Drawings

LIQUID CRYSTALLINE POLYMERIC COMPOSITIONS

CROSS REFERENCE TO RELATED APPLICATIONS

This application claims the benefit of U.S. Provisional Application No. 60/398,710, filed Jul. 25, 2002.

FIELD OF THE INVENTION

Liquid crystalline polymer compositions containing a perfluorinated polymer, a particulate aramid, and optionally hollow glass or quartz spheres usually have low dielectric constants, making them useful as substrates for electronic appplication such as electrical connectors, particularly when those applications involve high frequncy signals.

TECHNICAL BACKGROUND

Many types of materials are used as substrates for fabricating electrical connectors. One particular property of these materials, dielectric constant, is important when dealing with high frequency signals. If the dielectric constant of the substrate is too high, these signals may be attenuated to such a degree that the electronic apparatus does not function as designed. Therefore these substrates, particularly for this type of application, should have as low a dielectric constant as possible. However complicating this situation is the fact that other properties are also necessary and/or desirable in such substrates, such as good strength, resistance to high temperatures, good fire resistance, and good formability, etc. Making such compositions is a challenge, since improving one particular property often leads to deterioration of another (desired) property. Thus such compositions are constantly being sought.

U.S. Pat. No. 5,398,990 describes LCP compositions containing hollow glass spheres and polytetrafluoroethylene. The presence of aramids is not mentioned.

European Patent Application 512,401 describes certain laminates having low dielectric constants. The resin compositions contain molecularly porous aerogels, not hollow glass or quartz spheres.

Japanese Patent Application 0455437 describes a prepreg material which is made from a fluoroplastic, hollow glass spheres, and a cloth or paper-like material which can be an aramid. This material may be saturated with a thermosetting resin such as an epoxy resin, but LCPs aren't mentioned.

SUMMARY OF THE INVENTION

This invention concerns a composition, comprising, about 5 to about 25 percent by weight of a particulate aramid, about 5 to about 40 percent by weight of a particulate perfluorinated polymer, 0 to about 15 percent by weight of hollow glass or quartz spheres, and the remainder a liquid crytsalline polymer (LCP), wherein percent by weight are based on the total amount of said particulate aramid, perfluorinated thermoplasctic, hollow glass or quartz spheres, and liquid crystalline polymer present.

DETAILS OF THE INVENTION

Herein certain terms are used and some of them are:

By "particulate aramid" is meant aramid particles whose average largest dimension does not exceed 500μ, preferably 200 μm, and more preferably is less than 100 μm. The particles may be of any shape, for example short fibers, fibrils, fibrids, irregular, spherical, disc shaped, etc. The longest dimension for example of a fiber, fibril or fibrid will normally be its length. "Particulate aramid" also excludes aramids in the form of woven or nonwoven fabrics or aramid papers, even though the "particles" of aramid in any of these types of materials meet the size limitations described above. However there may be some adventitious entanglement between particulate aramid particles in the composition, formed when the composition is melt molded.

By a "perfluorinated" polymer is meant a polymer which does not contain any hydrogen in a repeat unit, but may contain traces of hydrogen, for example in end groups.

By a "thermoplastic" is meant a polymer which has a melting point or glass transition temperature above 30° C., preferably above 60° C. For a melting point to be effective for this criterion, the heat of melting should be at least 2 J/g for a polymer which is not liquid crystalline.

By a "liquid crystalline polymer" is meant a polymer that is anisotropic when tested using the TOT test or any reasonable variation thereof, as described in U.S. Pat. No. 4,118,372, which is hereby included by reference.

Preferably the perfluorinated polymer is present in the amount of about 10 to about 30 percent by weight. It is typically added as a particulate material to the other ingredients of the composition, to help assure uniform distribution of the various ingredients. Preferred perfluorinated polymers include the homo- and copolymers of tetrafluoroethylene (TFE). Specific preferred perfluorinated polymers include polytetrafluoroethylene (PTFE), a copolymer of TFE and hexafluoropropylene, and a copolymer of TFE and perfluoro(methyl vinyl ether). PTFE is an especially preferred perfluorinated polymer. PTFE is available as a fine powder from manufacture of PTFE aqueous dispersions, and such fine powders are useful for making the present compositions. Although PTFE is difficult to melt process for the purposes herein it is considered a thermoplastic. It is preferred that the perfluorinated polymer is a thermoplastic.

Hollow glass and quartz (micro)spheres, suitable for use herein, are available commercially from companies such as 3M Co., St. Paul, Minn., USA, and PQ Corp., Valley Forge, Pa., USA. They typically have diameters of about 20 μm to about 75 μm. It is preferred that their concentration in the composition is 0 to about 10 percent by weight. Quartz is a preferred material for the hollow microspheres. The spheres may be coated with an adhesion promoter such as a functional silane adhesion promoter to (nominally) improve adhesion between the spheres and the LCP.

Preferably the particulate aramid is about 8 to about 22 weight percent of the composition. All preferred percentages by weight herein are based on the total weight of named ingredients (as in claim 1), and any preferred percentage by weight may be combined with any other (preferred) percentage by weight.

Preferably the particulate aramid is a "powder" grade. Such grades contain particles which for the most part are not fiber-like or fibrillar-like. The aramid powder usually has a surface area of 2 m²/g or less, often 0.2 m²/g or less. It may be prepared by grinding the aramid, see for instance U.S. Pat. Nos. 5,474,82 and 5,811,042, and Research Disclosure, May 1996, p. 293. Preferably the particle size is such that at least 90 percent by weight, more preferably 95 percent by weight of the powder passes through a No. 100 (150 μm)

screen when tested according to ASTM Method D-1921-01, Test Method B. A composition containing a thermotropic LCP and powdered aramid has exceptionally good (improved) physical properties, such as tensile and flexural properties. A preferred aramid for the powder or any other particulate aramid form is poly(p-phenylene terephthalamide).

The compositions described herein can be made using typical thermoplastic mixing and processing techniques. For example all of the ingredients can be fed to a single or twin screw extruder (the ingredients do not have to be fed simultaneously or at the same place in the extruder), and using the mechanical action and/or heaters of the extruder the LCP, and optionally the perfluorinated polymer, are melted and mixed with the other ingredients. Preferably the composition formed should be relatively uniform, with the aramid particles, glass or quartz spheres and perfluorinated polymer being reasonably uniformly dispersed in the LCP.

The LCP is typically present as a continuous phase in the composition. The perfluorinated polymer and/or aramid are preferably present as discontinuous phases within the LCP continuous phase.

Other ingredients, such as those typically used in thermoplastic compositions, may also be present, particularly in small quantities. Such ingredients include fillers and reinforcing agents, pigments, dyes, antioxidants, lubricants, and nucleating agents. Preferably these other ingredients should not deleteriously significantly affect the important properties of the composition.

Typically the compositions of the present invention may be melt molded, while having lower dielectric constants (particularly at higher frequencies such as 5 GHz) than other typical LCP compositions, while maintaining other reasonable physical properties, for example tensile strength and elongation, and flexural strength and elongation. They often also have good flammability resistance, for example having a UL-94 rating of V-0 at 1.59 mm (1/16") thickness. This make them particularly useful in electrical or electronic parts such as electrical connectors where the reduced dielectric constant permits rapid passage with low parasitic losses in high frequency applications, and their strength properties are sufficient for this application. Melt molding can be carried out conventional techniques such as injection molding, extrusion, etc.

Herein certain properties are measured as follows:

Melting point and glass transition temperature are measured by method ASTM Method D3418. Melting points are taken as the temperature at the peak of the melting endotherm, and glass transition temperatures are taken as the midpoint of the transition. Melting points and glass transition temperatures are measured on the second heat, using a heating rate of 25° C./min. If more than one melting point is present the melting point of the polymer is taken as the highest of the melting points. Heats of fusion are taken as the area under the melting endotherm.

Dielectric constant (e'), dielectric loss (e"), and loss tangent (e"/e') are determined by ASTM Method D-150.

In the Examples tensile strength and tensile elongation to break were determined using ASTM Method D-638 (using strain gauges), flexural modulus and flexural strength were determined by ASTM Method D-790, and Heat Deflection Temperature (HDT) was determined by ASTM Method D648 at a 1.82 MPa load. Electrical properties were measured by ASTM Method D-257.

In the Examples the following LCPs were used (all ratios given are in molar parts):

A—hydroquinone 50; 4,4'-biphenol 50; terephthalic acid 70; 2,6-naphthalene dicarboxylic acid 30; 4-hydroxybenzoic acid 320.

B—hydroquinone 50; 4,4'-biphenol 50; terephthalic acid 85; 2,6-naphthalene dicarboxylic acid 15; 4-hydroxybenzoic acid 320.

C—hydroquinone 50; 4,4'-biphenol 50; terephthalic acid 87.5; 2,6-naphthalene dicarboxylic acid 12.5; 4-hydroxybenzoic acid 320, which also contains 25 ppm of potassium ion.

The LCPs are made by procedures described in U.S. Pat. Nos. 5,110,896 and 5,397,502, both of which are hereby included by reference.

EXAMPLES 1–8

Liquid crystalline polymers, designated A, B or C were compounded with 10 weight percent (20 weight percent in Example 4) Kevlar® Aramid Resin, Type # R120, or 10 weight percent 1.5 mm long Kevlar® cut floc (Example 7 and 8) (both available from E.I. DuPont de Nemours & Co., Wilmington, Del., USA), 10 weight percent hollow glass spheres (3M® Scotchlite® Glass Bubbles, Grade 522, available from the 3M Co., St Paul, Minn., USA), 20 weight percent Teflon® powder sold commercially by DuPont under the trade name of MP 1200 Powder, 0.25 weight percent terephthalic acid (Example 1 only), and 0.20 weight percent PE 190 polyethylene wax (sold by Clariant Corp, Charlotte, N.C.). The remainder of the material was the liquid crystalline polymer. All materials except the Kevlar® powder or floc and hollow glass spheres were fed through the feed zone of a 30 mm bilobal twin screw extruder manufactured by Werner & Pfleiderer (Stuttgart, Germany). Screw RPM was set at 250. The resulting compounded products were molded into 15.2 cm×15.2 cm×0.16 cm plaques (electrically heated mold) using a 6 oz. HPM molding machine and the following molding conditions: barrel temperatures 350° C., 110° C. mold temperature, boost time 2 sec, injection time 10 sec, hold time 15 sec, boost pressure 4.8 MPa, injection pressure 3.5 MPa, screw speed 120 RPM.

The plaques were tested for high frequency electrical properties, and these properties, and the polymer type used in each Example are given in Table 1.

In addition to the electrical properties, physicals were measured for the polymer of example 8 after extrusion into tensile bars. These physical properties are summarized below:

Tensile Strength/Tensile Elongation to break=66.9 MPa/ 2.42%

Flex Modulus/Flex Strength 4.70 GPa/86.9 MPa

UL-94 burn times on 0.16 cm thick bars (time/rating)/ HDT=(18.3 sec/V-0)/250° C.

Comparative Examples A–D

Liquid crystalline polymer A was compounded with (percentages are weight percents):

Comparative Examples A and B—with 30 percent glass fiber, 0.20 weight percent PE 190, and 5% $TiO_2$ Comparative Examples C and D—Same as A and B except 30 percent glass fiber replaced with 30 percent talc These compositions were molded into plaques and tested for high frequency electrical properties. The properties are given in Table 1.

TABLE 1

| Example | LCP | Sample Thickness, cm | Frequency, GHz | Dielectric Constant, DK | Dielectric Loss Coefficient, e" | Loss Tangent, e"/e', DF |
|---|---|---|---|---|---|---|
| 1 | C | 0.15 | 5.2270 | 2.9130 | 0.0107 | 0.0037 |
| 2 | C | 0.16 | 5.2130 | 2.9900 | 0.0106 | 0.0035 |
| 3 | A | 0.17 | 5.1980 | 2.9550 | 0.0110 | 0.0037 |
| 4 | C | 0.16 | 5.2150 | 2.9670 | 0.0130 | 0.0044 |
| 5 | B | 0.16 | 5.2120 | 2.9690 | 0.0104 | 0.0035 |
| 6 | A | 0.17 | 5.206 | 2.974 | 0.0111 | 0.0038 |
| 7 | A | 0.16 | 5.176 | 3.372 | 0.0102 | 0.003 |
| 8 | A | 0.16 | 5.177 | 3.394 | 0.0104 | 0.0031 |
| A | A | 0.16 | 5.082 | 4.147 | 0.0202 | 0.0049 |
| B | A | 0.17 | 5.071 | 4.151 | 0.0197 | 0.0047 |
| C | A | 0.16 | 5.146 | 3.701 | 0.0067 | 0.0018 |
| D | A | 0.15 | 5.148 | 3.724 | 0.007 | 0.0019 |

Example 6 the average of 2 plaques.

What is claimed is:

1. A composition, comprising, about 5 to about 25 percent by weight of a particulate aramid, about 5 to about 40 percent by weight of a particulate perfluorinated polymer, 0 about 15 percent by weight of hollow glass or quartz spheres, and the remainder a continuous phase of a liquid crystalline polymer, wherein percent by weight is based on the total amount of said particulate aramid, perfluorinated thermoplastic, hollow glass or quartz spheres, and liquid crystalline polymer present.

2. The composition of claim 1 wherein said particulate aramid is an aramid powder.

3. The composition of claim 1 wherein about 10 to about 30 weight percent of said perfluorinated polymer is present.

4. The composition of claim 1 wherein said perfluorinated polymer is a homo- or copolymer of tetrafluoroethylene.

5. The composition of claim 1 wherein 0 to about 10 weight percent of said hollow glass or quartz spheres are present.

6. The composition of claim 1 wherein about 8 to about 22 percent by weight of said particulate aramid is present.

7. The composition of claim 2 wherein said particulate aramid is poly(p-phenylene terephthalamide).

8. The composition of claim 1 wherein about 10 to about 30 weight percent of said perfluorinated polymer is present, wherein 0 to about 10 weight percent of said hollow glass or quartz spheres are present, and about 8 to about 22 percent by weight of said particulate aramid is present.

9. The composition of claim 8 wherein said particulate aramid is poly(p-phenylene terephthalamide).

10. An electrical or electronic part comprising the composition of claim 1.

11. An electrical connector comprising the composition of claim 1.

12. An electrical or electronic part comprising the composition of claim 8.

13. An electrical connector comprising the composition of claim 8.

14. An electrical or electronic part comprising the composition of claim 2.

15. An electrical or electronic part comprising the composition of claim 9.

* * * * *